(12) United States Patent
Li et al.

(10) Patent No.: US 12,356,612 B2
(45) Date of Patent: Jul. 8, 2025

(54) SEMICONDUCTOR STRUCTURE (71) Applicant: NANYA TECHNOLOGY CORPORATION, New Taipei (TW)

(72) Inventors: Wei Zhong Li, Taoyuan (TW); Hsih-Yang Chiu, Taoyuan (TW)

(73) Assignee: NANYA TECHNOLOGY CORPORATION, New Taipel (TW)

( * ) Notice: Subject to any disclaimer, the term of this patent is extended or adjusted under 35 U.S.C. 154(b) by 502 days.

(21) Appl. No.: 17/930,416

(22) Filed: Sep. 8, 2022

(65) Prior Publication Data

US 2024/0090208 A1 Mar. 14, 2024

(51) Int. Cl.
*H10B 20/20* (2023.01)

(52) U.S. Cl.
CPC .................... *H10B 20/20* (2023.02)

(58) Field of Classification Search
CPC .... H10B 20/20; H01L 23/5252; H01L 23/481
See application file for complete search history.

(56) References Cited

U.S. PATENT DOCUMENTS

| | | | | |
|---|---|---|---|---|
| 9,613,714 B1 * | 4/2017 | Wong | ...................... | G11C 17/16 |
| 9,941,289 B2 * | 4/2018 | Choi | ...................... | G11C 17/16 |
| 11,145,379 B2 * | 10/2021 | Cho | ...................... | G11C 17/165 |
| 2013/0299890 A1 | 11/2013 | Oh et al. | | |
| 2021/0343695 A1 | 11/2021 | Chiu | | |

FOREIGN PATENT DOCUMENTS

TW 202143396 A 11/2021

* cited by examiner

*Primary Examiner* — Allison Bernstein
(74) *Attorney, Agent, or Firm* — CKC & Partners Co., LLC (57) ABSTRACT

A semiconductor structure includes a substrate, an anti-fuse, first and second transistors, a contact structure, and a dielectric layer. The substrate includes a well region and first and second conductivity type doped regions in the well region, in which the second conductivity type doped region surrounds the first conductivity type doped region and includes a first portion and a second portion perpendicular to the first portion in a top view. The anti-fuse is in an anti-fuse region of the first conductivity type doped region. The first and second transistors are in the well region. The anti-fuse is disposed between the first and second transistors, and the anti-fuse is electrically connected to the first and second transistors. The contact structure is above the anti-fuse. The dielectric layer is between the contact structure and the anti-fuse region of the first conductivity type doped region.

20 Claims, 5 Drawing Sheets

SEMICONDUCTOR STRUCTURE

BACKGROUND

Technical Field

The present disclosure relates to a semiconductor structure.

Description of Related Art

With the rapid growth of electronic industry, the development of integrated circuits (ICs) has achieved high performance and miniaturization. Technological advances in IC materials and design have produced generations of ICs where each generation has smaller and more complex circuits than the previous generation.

As the number of electronic devices on single chips rapidly increases, three-dimensional (3D) integrated circuit layouts, or stacked chip designs, have been utilized for certain semiconductor structures in an effort to overcome the feature size and density limitations associated with 2D layouts. However, the feature size and density are still needed to be improved.

SUMMARY

One aspect of the present disclosure is a semiconductor structure.

According to some embodiments of the present disclosure, a semiconductor structure includes a substrate, an anti-fuse, a first transistor, a second transistor, a contact structure, and a dielectric layer. The substrate includes a well region, a first conductivity type doped region in the well region, and a second conductivity type doped region in the well region, in which the second conductivity type doped region surrounds the first conductivity type doped region and includes a first portion and a second portion perpendicular to the first portion in a top view. The anti-fuse is located in an anti-fuse region of the first conductivity type doped region. The first transistor and the second transistor are located in the well region, in which the anti-fuse is disposed between the first transistor and the second transistor, and the anti-fuse is electrically connected to the first transistor and the second transistor. The contact structure is located above the anti-fuse. The dielectric layer is located between the contact structure and the anti-fuse region of the first conductivity type doped region.

In some embodiments, the second conductivity type doped region further includes a third portion parallel to the first portion in the top view.

In some embodiments, the second conductivity type doped region further includes a fourth portion perpendicular to the third portion in the top view.

In some embodiments, the first portion, the second portion, the third portion, and the fourth portion of the second conductivity type doped region form a ring profile in the top view.

In some embodiments, a lengthwise direction of the contact structure is perpendicular to that of the second portion of the second conductivity type doped region in the top view.

In some embodiments, the semiconductor structure further includes a first contact and a second contact located above the anti-fuse region. The first contact and the second contact are located on opposite sides of the contact structure.

In some embodiments, the semiconductor structure further includes a third contact and a fourth contact. The third contact is located above a source/drain region of the first transistor. The fourth contact is located above a source/drain region of the second transistor.

In some embodiments, the semiconductor structure further includes a first conductive structure and a second conductive structure. The first conductive structure is located above the first transistor and the anti-fuse such that the anti-fuse is electrically connected to the first transistor. The second conductive structure is located above the second transistor and the anti-fuse such that the anti-fuse is electrically connected to the second transistor.

In some embodiments, the first transistor and the second transistor are connected in parallel and share a gate structure.

In some embodiments, a top surface of the contact structure is substantially coplanar with a top surface of the gate structure of the first transistor.

Another aspect of the present disclosure is a semiconductor structure.

According to some embodiments of the present disclosure, a semiconductor structure includes a substrate, an isolation structure, an anti-fuse, a first transistor, a second transistor, and a contact structure. The substrate includes a well region, a first conductivity type doped region in the well region, and a second conductivity type doped region in the well region, in which the second conductivity type doped region of the substrate surrounds the first conductivity type doped region and includes a first portion and a second portion perpendicular to the first portion in a top view. The isolation structure is located in the substrate and configured to electrically insulate the first conductivity type doped region from the second conductivity type doped region. The anti-fuse is located in an anti-fuse region of the first conductivity type doped region. The first transistor and the second transistor are located in the well region, in which the anti-fuse is located between the first transistor and the second transistor, and the anti-fuse is electrically connected to the first transistor and the second transistor. The contact structure is located above the anti-fuse.

In some embodiments, the first transistor and the second transistor are connected in parallel and share a first gate structure.

In some embodiments, the semiconductor structure further includes a third transistor and a fourth transistor, in which the second transistor is closer to the third transistor than the first transistor, and the third transistor and the fourth transistor are connected in parallel and share a second gate structure.

In some embodiments, a minimum distance between the first gate structure and the second gate structure is in a range of about 40 nanometers to about 200 nanometers.

In some embodiments, the semiconductor structure further includes a conductive structure located above the second transistor and the third transistor such that the second transistor is electrically connected to the third transistor.

In some embodiments, the well region has a conductivity type the same as that of the second conductivity type doped region and different from that of the first conductivity type doped region.

In some embodiments, the first portion of the second conductivity type doped region has a strip profile in the top view.

In some embodiments, the second portion of the second conductivity type doped region has a shape substantially the same as that of the first portion of the second conductivity type doped region in the top view.

In some embodiments, the second conductivity type doped region further includes a third portion and a fourth portion. The third portion is parallel to the first portion in the top view, and the fourth portion is perpendicular to the third portion in the top view.

In some embodiments, the first portion, the second portion, the third portion, and the fourth portion of the second conductivity type doped region form a ring profile in the top view.

In the aforementioned embodiments, since the second conductivity type doped region of the substrate surrounds the first conductivity type doped region and includes a first portion and a second portion perpendicular to the first portion in the top view, the semiconductor structure can be more uniform. Further, a feature size of the semiconductor structure can be decreased, thereby increasing the integration density. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
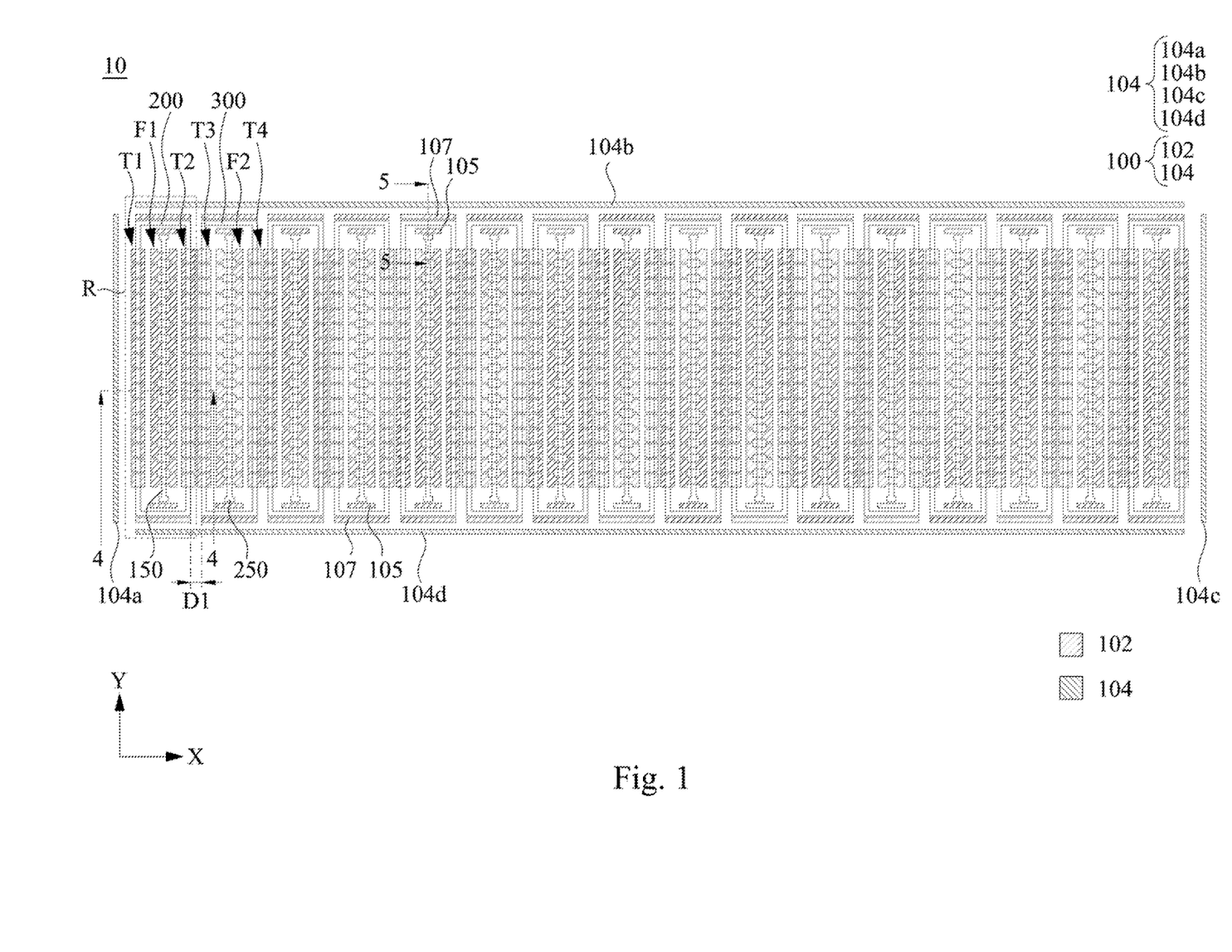
FIG. 1 is a top view of a layout of a semiconductor structure in accordance with some embodiments of the present disclosure.
Figure 2:
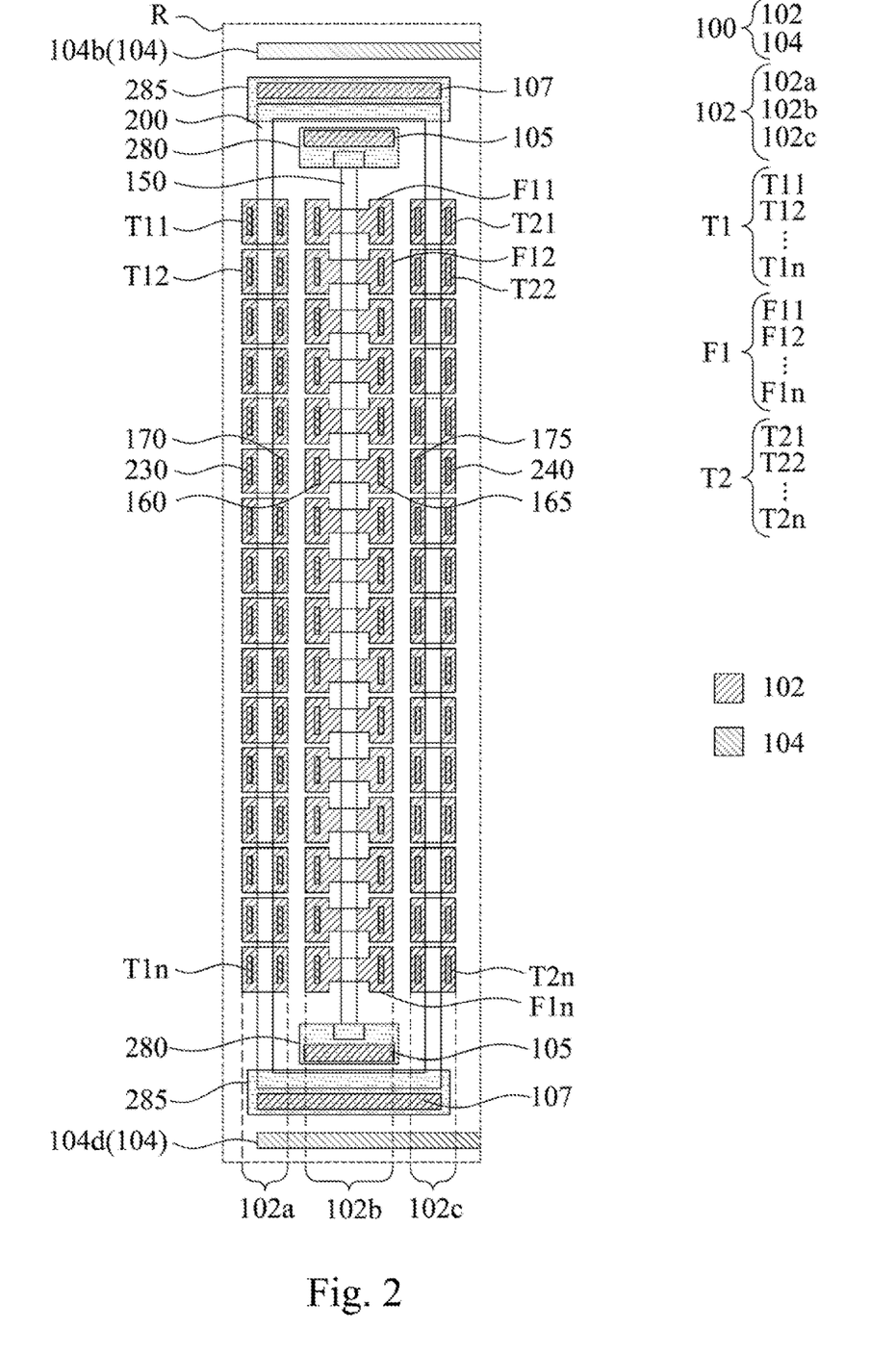
FIG. 2 shows a partially enlarged view of FIG. 1.
Figure 4:
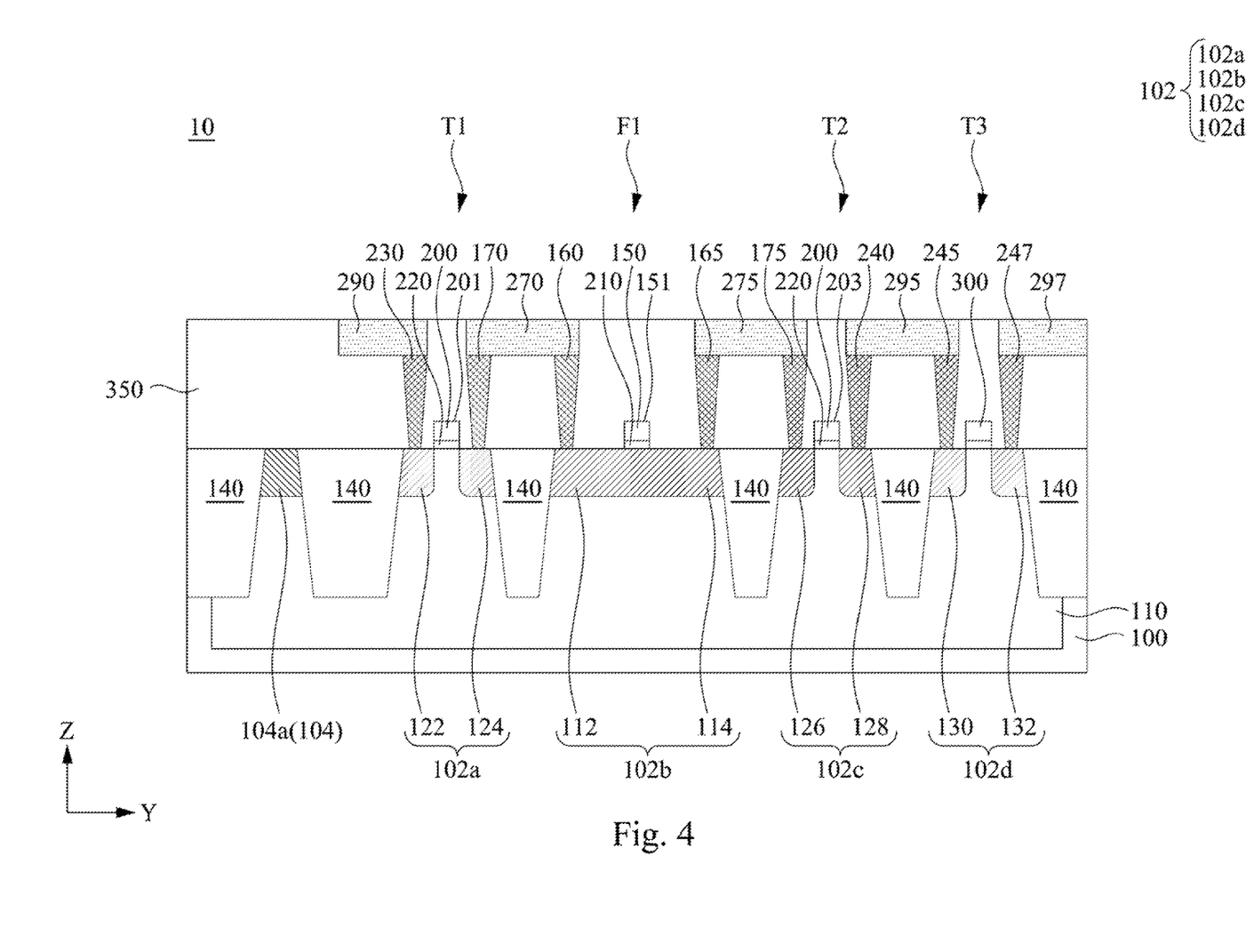
FIG. 4 is a cross-sectional view taken along line 4-4 of the semiconductor structure of FIG. 1.

FIG. 1 is a top view of a layout of a semiconductor structure 10 in accordance with some embodiments of the present disclosure, FIG. 2 shows a partially enlarged view of a region R of FIG. 1, and FIG. 4 is a cross-sectional view taken along line 4-4 of the semiconductor structure 10 of FIG. 1. Referring to FIG. 1, FIG. 2 and FIG. 4, a semiconductor structure 10 includes a substrate 100, first transistors T1, second transistors T2, anti-fuses F1, a contact structure 150, and a dielectric layer 210. The substrate 100 includes a well region 110, a first conductivity type (e.g., N-type in this case) doped region 102 in the well region 110, and second conductivity type (e.g., P-type in this case) doped region 104 in the well region 110. The second conductivity type doped region 104 surrounds the first conductivity type doped regions 102 and the second conductivity type doped region 104 includes a first portion 104a and a second portion 104b perpendicular to the first portion 104a in a top view (i.e., FIG. 1). Specifically, a lengthwise direction (i.e., along X-axis direction) of the second portion 104b is perpendicular to a lengthwise direction (i.e., along Y-axis direction) of the first portion 104a in the top view. The first transistors T1 are located in a first device region 102a of the first conductivity type doped region 102. The second transistors T2 are located in a second device region 102c of the first conductivity type doped region 102. Specifically, source/drain regions 122 and 124 of the first transistors T1 are located in the first device region 102a, and source/drain regions 126 and 128 of the second transistors T2 are located in the second device region 102c. The anti-fuses F1 are located in an anti-fuse region 102b of the first conductivity type doped region 102, in which the anti-fuse region 102b is directly between the first device region 102a and the second device region 102c. Each of the anti-fuses F1 is directly between two corresponding first transistor T1 and second transistor T2, and each of the anti-fuses F1 is electrically connected to corresponding first transistor T1 and second transistor T2. The contact structure 150 is located above the anti-fuses F1. The dielectric layer 210 is located between the contact structure 150 and the anti-fuse region 102b of the first conductivity type doped region 102. Since the second conductivity type doped region 104 of the substrate 100 surrounds the first conductivity type doped region 102 and includes the first portion 104a and the second portion 104b perpendicular to the first portion 104a in the top view, the semiconductor structure 10 can be more uniform. Further, a feature size of the semiconductor structure 10 can be decreased, thereby increasing the integration density. As a result, the performance of the semiconductor structure 10 can be improved.

The second conductivity type doped region 104 is directly above the well region 110. The second conductivity type doped region 104 is configured to provide a signal source to the well region 110. In some embodiments, the second conductivity type doped region 104 is in contact with the well region 110. In some other embodiments, a conductive feature (not shown) may be located in the substrate 100 for interconnecting the second conductivity type doped region 104 and the well region 110. The well region 110 may be a P-type region, and the second conductivity type doped region 104 may be P+ region (interchangeably referred as heavily doped P-type regions) having P-type impurity concentration greater than the well region 110. The second conductivity type doped region 104 may have a conductivity type the same as that of the well region 110. For example, the second conductivity type doped region 104 and the well region 110 include P-type dopants such as boron (B), BF$_2$, BF$_3$, combinations thereof, or the like. In some embodiments, source/drain regions 122, 124, 126, 128, 130 and 132 are located in the well region 110. In other words, the source/drain regions 122 and 124 are located in the first device region 102a of the first conductivity type doped region 102, and the source/drain regions 126 and 128 are located in the second device region 102c of the first conductivity type doped region 102. In some embodiments, the source/drain regions 122 and 124 are referred as source/drain regions of the first transistors T1, and the source/drain regions 126 and 128 are referred as source/drain regions of the second transistors T2. For example, one of the first transistors T1 includes the source/drain regions 122 and 124, and the gate structure 200 between the source/drain regions 122 and 124. Further, one of the second transistors T2 includes the source/drain regions 126 and 128, and the gate structure 200 between the source/drain regions 126 and 128. The source/drain regions (source/drain regions 122, 124, 126, 128, 130 and 132) and the anti-fuse region 102b may be N+ or heavily doped regions having N-type impurity concentration greater than the well region 110. The first conductivity type doped region 102 may have a conductivity type different from that of the well region 110 (or the second conductivity type doped region 104). For example, the first conductivity type doped region 102 includes N-type dopants such as phosphorous (P), arsenic (As), antimony (Sb), combinations thereof, or the like.

The second conductivity type doped region 104 further includes a third portion 104c and a fourth portion 104d. The third portion 104c is parallel to the first portion 104a. Specifically, both of a lengthwise direction of the first portion 104a and a lengthwise direction of the third portion 104c are along Y-axis direction. A shape of the first portion 104a is substantially the same as a shape of the third portion 104c. In some embodiments, the first portion 104a and the third portion 104c have strip profiles. In some embodiments, the first portion 104a and the third portion 104c have straight profiles. In X-axis direction, the first conductivity type doped region 102 is located between the first portion 104a and the third portion 104c of the second conductivity type doped region 104 such that the second conductivity type doped region 104 surrounds the first conductivity type doped region 102. Further, the fourth portion 104d is perpendicular to the third portion 104c (or the first portion 104a), and the fourth portion 104d is parallel to the second portion 104b. Specifically, both of a lengthwise direction of the second portion 104b and a lengthwise direction of the fourth portion 104d are along X-axis direction. A shape of the second portion 104b is substantially the same as a shape of the fourth portion 104d. In some embodiments, the second portion 104b and the fourth portion 104d have strip profiles. In some embodiments, the second portion 104b and the fourth portion 104d have straight profiles. In Y-axis direction, the first conductivity type doped region 102 is located between the second portion 104b and the fourth portion 104d of the second conductivity type doped region 104 such that the second conductivity type doped region 104 surrounds the first conductivity type doped region 102. In some embodiments, the first portion 104a, the second portion 104b, the third portion 104c, and the fourth portion 104d have the same profiles (shapes). For example, the first portion 104a, the second portion 104b, the third portion 104c, and the fourth portion 104d have strip profiles (or straight profiles). In some embodiments, the first portion 104a, the second portion 104b, the third portion 104c, and the fourth portion 104d of the second conductivity type doped region 104 together form a ring profile. In some other embodiments, the first portion 104a, the second portion 104b, the third portion 104c, and the fourth portion 104d of the second conductivity type doped region 104 together form a rectangle profile. The first portion 104a may be not connected to the second portion 104b and the fourth portion 104d, such that the second conductivity type doped region 104 has a first opening between the first portion 104a and the second portion 104b and has a second opening between the first portion 104a and the fourth portion 104d. Alternatively, the first portion 104a may be connected to the second portion 104b and the fourth portion 104d such that the second conductivity type doped region 104 does not have openings therebetween. Similarly, the third portion 104c may be not connected to the second portion 104b and the fourth portion 104d, such that the second conductivity type doped region 104 has a third opening between the third portion 104c and the second portion 104b and has a fourth opening between the third portion 104c and the fourth portion 104d. Alternatively, the third portion 104c may be connected to the second portion 104b and the fourth portion 104d such that the second conductivity type doped region 104 does not have openings therebetween.

In some embodiments, a lengthwise direction of the contact structure 150 is along Y-axis direction. The lengthwise direction of the contact structure 150 (i.e., Y-axis direction) is perpendicular to the lengthwise direction of the second portion 104b (or the fourth portion 104d) of the second conductivity type doped region 104 in the top view. It is noted that FIG. 1 is the top view of the layout of the semiconductor structure 10 and illustrate the substrate 100, the contact structures (e.g., contact structure 150) above the substrate 100 and the gate structures (e.g., gate structure 200) above the substrate 100, and other overlying layers above the substrate 100 are omitted in FIG. 1 and illustrate in FIG. 2 for clarity.

Figure 3:
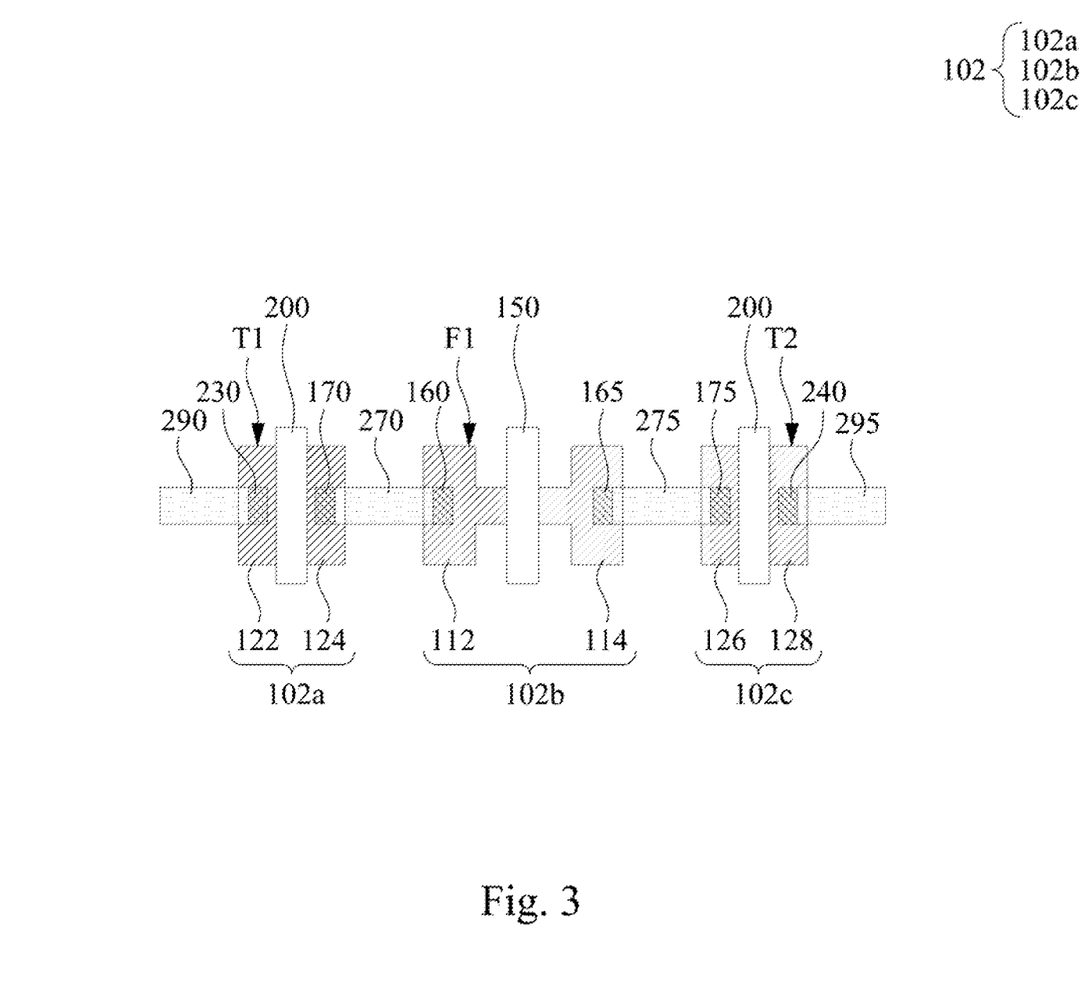
FIG. 3 is a schematic view for illustrating first transistors, anti-fuses, and second transistors of the semiconductor structure.

FIG. 3 is a schematic view for illustrating first transistors T1, anti-fuses F1, and second transistors T2 of the semiconductor structure 10. Referring to FIG. 1 to FIG. 3, the semiconductor structure 10 includes first conductive structures 270 above each of the first transistors T1 and each of the anti-fuses F1, such that each of the anti-fuses F1 is electrically connected to each of the first transistors T1 through the first conductive structures 270 extending above the first device region 102a of the first conductivity type doped region 102 to the anti-fuse region 102b of the first conductivity type doped region 102. Further, the semiconductor structure 10 includes second conductive structures 275 above each of the second transistors T2 and each of the anti-fuses F1, such that each of the anti-fuses F1 is electrically connected to each of the second transistors T2 through the second conductive structures 275 extending above the second device region 102c of the first conductivity type doped region 102 to the anti-fuse region 102b of the first conductivity type doped region 102. As a result, the anti-fuse F1 is electrically connected to the first transistor T1 and the second transistor T2 respectively through the first conductive structure 270 and the second conductive structure 275. The first transistor T1 and the second transistor T2 are configured to both read and write to the anti-fuse F1. It is noted that FIG. 3 is a schematic view for illustrating the first transistors T1, the anti-fuses F1, and the second transistors T2 of FIG. 1 when the first conductive structures 270 and the second conductive structures 275 are formed above the first conductivity type doped regions 102, and the first conductive structures 270 and second conductive structures 275 in FIG. 1 are omitted for clarity.

As shown in FIG. 1 and FIG. 2, the anti-fuses F1 include a plurality of anti-fuse cells F11, F12 to F1n. In greater details, anti-fuse cells F11 to F1n are located in the anti-fuse region 102b of the first conductivity type doped region 102, in which the contact structure 150 interconnects the anti-fuse cells F11 to F1n. The anti-fuses F1 (i.e., anti-fuse cells F11 to F1n) are aligned with each other and each has a dumbbell profile. Further, the first transistors T1 include a plurality of transistor cells T11, T12 to T1n, and the second transistors T2 include a plurality of transistor cells T21, T22 to T2n. The first transistors T1 and the second transistors T2 are connected in parallel and share a gate structure 200.

In some embodiments, the semiconductor structure 10 further includes third transistors T3, anti-fuses F2, and fourth transistors T4. Configurations regarding the third transistors T3, the anti-fuses F2, and the fourth transistors T4 are respectively similar to or the same as those of the first transistors T1, the anti-fuses F1, and the second transistors T2, and, therefore, a description in this regard will not be repeated hereinafter. For example, the contact structure 250 interconnects a plurality of anti-fuse cells of the anti-fuses F2 (i.e., the anti-fuses share the contact structure 250 thereon). The third transistors T3 and the fourth transistors T4 are connected in parallel and share a gate structure 300. The second transistors T2 are closer to the third transistors T3 than the first transistors T1. In some embodiments, a minimum distance D1 between the gate structure 200 and the gate structure 300 is in a range of about 40 nanometers to about 200 nanometers. If the minimum distance D1 is greater than 200 nanometers, an occupied area would be too large such that a feature size of the semiconductor structure 10 would be increased; if the minimum distance D1 is smaller than 40 nanometers, the gate structure 200 and the gate structure 300 would be too close such that a merge problem or an interference problem would occur.

In some embodiments, the semiconductor structure 10 includes a plurality of first memory arrays and a plurality of second memory arrays alternatingly arranged along X-axis direction. In other words, the first transistors T1, the anti-fuses F1, and the second transistors T2 are referred as first memory arrays, and the third transistors T3, the anti-fuses F2, and the fourth transistors T4 are referred as second memory arrays. In some embodiments, the first memory arrays and the second memory arrays are arranged uniformly and have the same pitch. For example, a pitch between one of the first memory arrays and the closest second memory array is the same as a pitch between another one of the first memory arrays and the closest second memory array. The first memory arrays and the second memory arrays are connected through conductive structures 295, which will be discussed in greater detail below. In other words, the conductive structures 295 are electrically connected to the second transistors T2 and the third transistors T3 such that the first memory arrays are electrically connected to the second memory array. The conductive structures 295 may be referred as "up-layers metal" above the substrate 100. The conductive structures 295 may be consistent (e.g., aligned to or overlapping with each other), thereby improving the performance of the semiconductor structure 10.

In some embodiments, as shown in FIG. 1 to FIG. 4, the semiconductor structure 10 further includes first contacts 160 above a first portion 112 of the anti-fuse region 102b and second contacts 165 above a second portion 114 of the anti-fuse region 102b. In other words, the first contacts 160 and the second contacts 165 are located on opposite sides of the contact structure 150. Stated differently, the first contacts 160 are located on a side of the contact structure 150 near first transistors T1, and the second contacts 165 are located on an opposite side of the contact structure 150 near second transistors T2. It is noted that each of the anti-fuses F1 includes the first portion 112 and the second portion 114 in the anti-fuse region 102b of the first conductivity type doped region 102. The contact structure 150 is located above the anti-fuse region 102b, and the contact structure 150 is directly between the first contact 160 and the second contact 165. In some embodiments, the first portion 112 of the anti-fuse region 102b of the anti-fuse F1 is closer to the first transistor T1 than the second portion 114 of the anti-fuse region 102b of the anti-fuse F1, and the second portion 114 of the anti-fuse region 102b of the anti-fuse F1 is closer to the second transistor T2 than the first portion 112 of the anti-fuse region 102b of the anti-fuse F1.

In some embodiments, the semiconductor structure 10 further includes third contacts 170 above the source/drain region 124 of the first transistor T1 and fourth contacts 175 above the source/drain region 126 of the second transistor T2. Each of the first contacts 160 above the anti-fuse F1 is electrically connected to each of the third contacts 170 above the first transistor T1 through the first conductive structure 270, and each of the second contacts 165 above the anti-fuse F1 is electrically connected to each of the fourth contacts 175 above the second transistor T2 through the second conductive structure 275.

In some embodiments, the gate structure 200 surrounds the contact structure 150 in the top view (see FIG. 1). The gate structure 200 is located above the first device region 102a and the second device region 102c of the first conductivity type doped region 102, and the contact structure 150 is located above the anti-fuse region 102b of the first conductivity type doped region 102. In some embodiments, a top surface 151 of the contact structure 150 is substantially coplanar with a top surface 201 of the gate structure 200 of the first transistor T1. In some embodiments, the top surface 151 of the contact structure 150 is substantially coplanar with a top surface 203 of the gate structure 200 of the second transistor T2. In some embodiments, a width of the gate structure 200 of first transistor T1 is substantially the same as a width of the contact structure 150, and a thickness of the gate structure 200 of first transistor T1 is substantially the same as a thickness of the contact structure 150.

In some embodiments, the semiconductor structure 10 further includes a gate dielectric layer 220 between the gate structure 200 and the first device region 102a of the first conductivity type doped regions 102. The gate dielectric layer 220 is also located between the gate structure 200 and the second device region 102c of the first conductivity type doped regions 102. In some embodiments, the dielectric layer 210 is located between the contact structure 150 and the anti-fuse region 102b. In some embodiments, programming mechanism by using the anti-fuse F1 to store digital information is to apply a voltage to the contact structure 150 higher than that of the first contact 160 such that a current flows from the contact structure 150 to the first contact 160 to convert the dielectric layer 210 into a permanent electrically conductive path so as to conduct between the contact structure 150 and the anti-fuse region 102b (including the first portion 112 and the second portion 114). As such, the anti-fuse F1 is in an "On" state. Conversely, the unprogrammed anti-fuse F1 is in an "Off" state.

In some embodiments, the anti-fuse region 102b is referred to a first electrode of the anti-fuse F1, and the contact structure 150 on the anti-fuse region 102b is referred to a second electrode of the anti-fuse F1. A breakdown on the dielectric layer 210 between the first electrode (the anti-fuse region 102b) and the second electrode (the contact structure 150) may occur and forms a short circuit.

In some embodiments, the semiconductor structure 10 further includes contacts 230, 240, 245, and 247. The contact 230 is located above the source/drain region 122 of the first transistor T1, the contact 240 is located above the source/drain region 128 of the second transistor T2, the contact 245 is located above a source/drain region 130 of the third transistor T3, and the contact 247 is located above the source/drain region 132 of the third transistor T3. It is noted that the first conductivity type doped regions 102 of the substrate 100 further includes a third device region 102d adjacent to the second device region 102c, and the source/drain regions 130 and 132 of the third transistor T3 are located in the third device region 102d. In some embodiments, the semiconductor structure 10 further includes conductive structures 290, 295, and 297. The conductive structure 290 is electrically connected to the contact 230. The conductive structure 295 is electrically connected to the contact 240 and the contact 245 such that the second transistor T2 is electrically connected to the third transistor T3. The conductive structure 297 is electrically connected to the contact 247.

Figure 5:
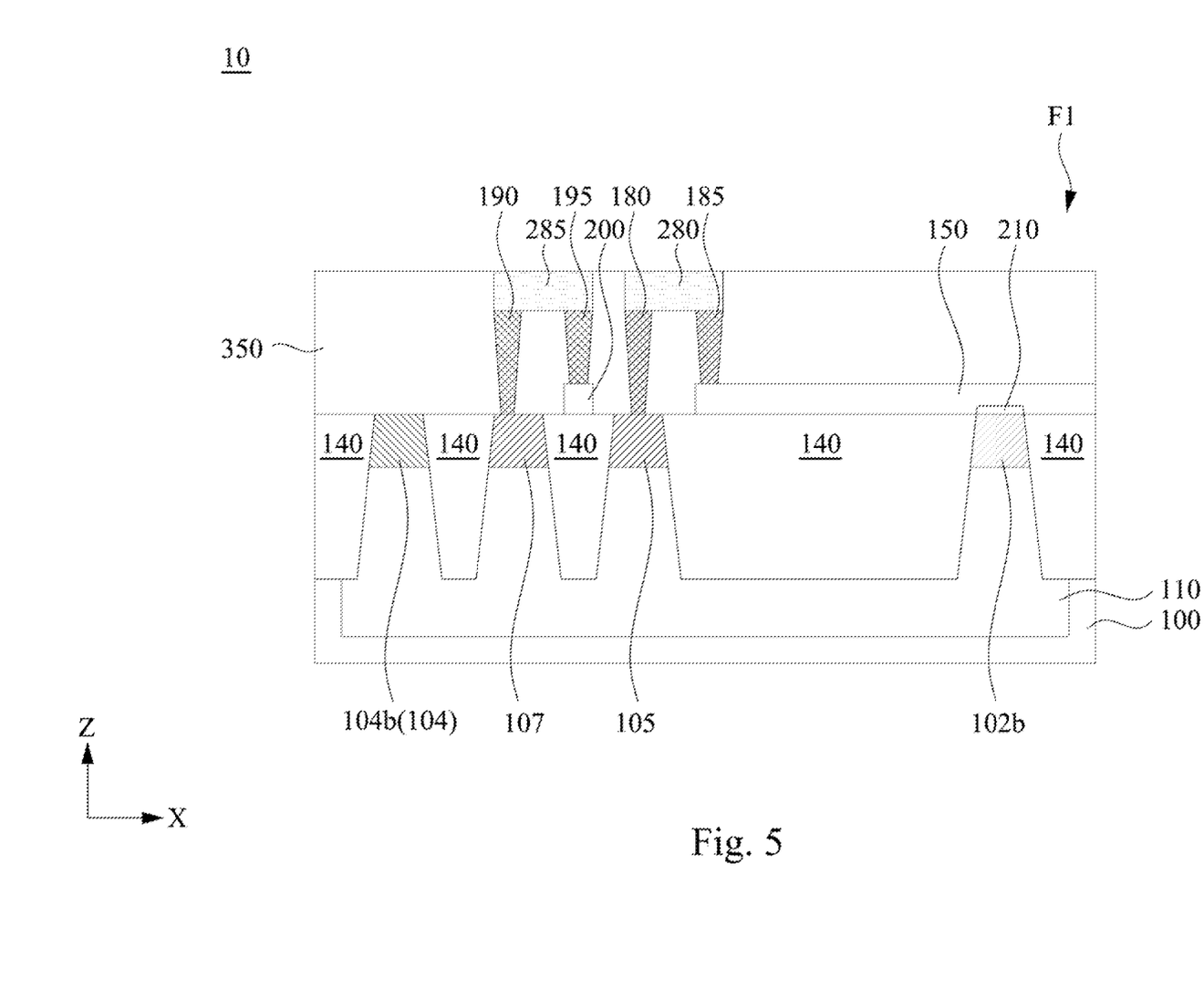
FIG. 5 is a cross-sectional view taken along line 5-5 of the semiconductor structure of FIG. 1.

FIG. 5 is a cross-sectional view taken along line 5-5 of the semiconductor structure 10 of FIG. 1. Referring to FIG. 1 to FIG. 5, the semiconductor structure 10 further includes antenna doped regions 105 and antenna doped regions 107 in the first conductivity type doped region 102. The antenna doped regions 105 and 107 are configured to export charges away to prevent the charges from damaging the dielectric layers (e.g., dielectric layer 210 and/or gate dielectric layer 220). The antenna doped regions 105 are located between the contact structure 150 and the gate structure 200, and the antenna doped regions 107 are located between the gate structure 200 and the second portion 104b (or the fourth portion 104d) of the second conductivity type doped region 104. In some embodiments, the semiconductor structure 10 includes conductive structures 280 above the antenna doped regions 105 and the contact structure 150, such that the antenna doped regions 105 are electrically connected to the contact structure 150 (that is electrically connected to the anti-fuses F1) through the conductive structures 280. The conductive structures 280 extend above the antenna doped regions 105 to the contact structure 150. Further, the semiconductor structure 10 includes conductive structures 285 above the antenna doped regions 107 and gate structure 200, such that the antenna doped regions 107 are electrically connected to the gate structure 200 (that is electrically connected to the first transistors T1 or the second transistors T2) through the conductive structures 285. The conductive structures 285 extend above the antenna doped regions 107 to the gate structure 200.

In some embodiments, the semiconductor structure 10 includes contacts 180 above the antenna doped regions 105 and contacts 185 above the contact structure 150. The contacts 180 are in contact with the antenna doped regions 105, and the contacts 185 are in contact with the contact structure 150. Each of the contacts 180 above the antenna doped regions 105 is electrically connected to each of the contacts 185 above the contact structure 150 through the conductive structure 280. In some embodiments, the semiconductor structure 10 includes contacts 190 above the antenna doped regions 107 of the first conductivity type doped region 102 and contacts 195 above the gate structure 200. The contacts 190 are in contact with the antenna doped regions 107, and the contacts 195 are in contact with the gate structure 200. Each of the contacts 190 above the antenna doped regions 107 is electrically connected to each of the contacts 195 above the gate structure 200 through the conductive structure 285.

In some embodiments, the substrate 100 is a semiconductor substrate including silicon. In some other embodiments, the substrate 100 includes another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the well region 110 is formed by doping the substrate 100 with first dopants having second conductivity type (e.g., P-type in this case) such as boron (B), $BF_2$, $BF_3$, combinations thereof, or the like. For example, an implantation process is performed on the substrate 100 to form the well region 110, followed by an annealing process to activate the implanted first dopants of the well region 110. In some embodiments, the well region 110 is referred as a deep P-type well (DPW). In some embodiments, the first conductivity type doped region 102 is formed by doping a top portion of the well region 110 with second dopants having first conductivity type (e.g., N-type in this case) such as phosphorous (P), arsenic (As), antimony (Sb), combinations thereof, or the like. For example, an implantation process is performed on the top portion of the well region 110 to form the first conductivity type doped region 102, followed by an annealing process to activate the implanted second dopants of the first conductivity type doped region 102. The second conductivity type doped region 104 is formed by doping another top portion of the well region 110 with third dopants having second conductivity type (e.g., P-type in this case) such as boron (B), $BF_2$, $BF_3$, combinations thereof, or the like. For example, an implantation process is performed on the another top portion of the well region 110 to form the second conductivity type doped region 104, followed by an annealing process to activate the implanted third dopants of the second conductivity type doped region 104.

In some embodiments, the semiconductor structure 10 includes isolation structures 140 in the substrate 100. The isolation structures 140 are formed to laterally surrounding the first conductivity type doped region 102 and the second conductivity type doped region 104 for proper electrical isolation. Specifically, the isolation structures 140 are configured to electrically insulate the first conductivity type doped region 102 from the second conductivity type doped region 104. In some embodiments, the isolation structures 140 are shallow trench isolation (STI). The formation of the isolation structures 140 may include etching a trench in the substrate 100 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation structures 140 are created using a process sequence such as: growing a pad oxide, forming a low pressure chemical vapor deposition (LPCVD) nitride layer, patterning STI openings using photoresist and masking, etching trenches in the substrate 100, optionally growing a thermal oxide trench liner to improve the trench interface, filling the trenches with CVD oxide, and using chemical mechanical planarization (CMP) to remove the excessive dielectric layers.

In some embodiments, the gate structure 200 and the contact structure 150 are simultaneously formed in a same processing procedure. In some embodiments, the gate structure 200 and the contact structure 150 include the same material, such as metals, semiconductive materials (e.g., polycrystalline-silicon (poly-Si), poly-crystalline silicon-germanium (poly-SiGe)), or other suitable materials. In some embodiments, the gate structure 200 and the contact structure 150 respectively include work function metal layer(s), capping layer(s), fill layer(s), and/or other suitable layers that are desirable in a metal gate stack. In some embodiments, the fill layer in the gate structure 200 and/or the contact structure 150 may include tungsten (W). The fill layer may be deposited by ALD, PVD, CVD, or other suitable process.

In some embodiments, the dielectric layer 210 and the gate dielectric layer 220 are simultaneously formed in a same processing procedure. In some embodiments, the dielectric layer 210 and the gate dielectric layer 220 include the same material, such as silicon dioxide, silicon nitride, a high-k dielectric material or other suitable material. In various examples, the dielectric layer 210 and the gate dielectric layer 220 are deposited by a thermal oxidation process, an ALD process, a CVD process, a subatmospheric CVD (SACVD) process, a flowable CVD process, a PVD process, or other suitable process.

In some embodiments, the semiconductor structure 10 further includes an interlayer dielectric (ILD) layer 350 above the substrate 100. The ILD layer 350 may be formed above the substrate 100 to a level above the top surface 201 (or top surface 203) of the gate structure 200 and the top surface 151 of the contact structure 150 such that the gate structure 200 and the contact structure 150 are embedded in. The ILD layer 350 may be formed by chemical vapor deposition (CVD), high-density plasma CVD, spin-on, sputtering, or other suitable methods. In some embodiments, the ILD layer 350 includes silicon oxide, phosphosilicate glass (PSG), borophosphosilicate glass (BPSG), fluorinated silicate glass (FSG), or other suitable materials. In some other embodiments, the ILD layer 350 may include silicon oxynitride, silicon nitride, compounds including Si, O, C and/or H (e.g., silicon oxide, SiCOH and SiOC), a low-k dielectric material (dielectric material with dielectric constant less than about 3.9, the dielectric constant of the thermal silicon oxide), or organic materials (e.g., polymers). In some embodiments, a planarization process is performed to remove portions of the ILD layer 350 such that a top surface of the ILD layer 350 is coplanar with top surfaces of the first conductive structure 270 and the second conductive structure 275. The planarization process may be a chemical mechanical planarization (CMP) process.

In some embodiments, as shown in FIG. 1 to FIG. 5, the contacts (first contacts 160, second contacts 165, third contacts 170, fourth contacts 175, and contacts 180, 185, 190, 195, 230, 240, 245, and 247) in the ILD layer 350 are simultaneously formed in a same processing procedure. The contacts (first contacts 160, second contacts 165, third contacts 170, fourth contacts 175, and contacts 180, 185, 190, 195, 230, 240, 245, and 247) may include the same material, such as copper (Cu), iron (Fe), aluminum (Al), or other suitable conductive materials. The contacts (first contacts 160, second contacts 165, third contacts 170, fourth contacts 175, and contacts 180, 185, 190, 195, 230, 240, 245, and 247) may be formed by chemical vapor deposition (CVD), physical vapor deposition (PVD), atomic layer deposition (ALD), or other suitable processes. In some embodiments, the conductive structures (first conductive structures 270, second conductive structures 275, and conductive structures 280, 285, 290, 295, and 297) may include the same material, such as polysilicon, metals, or other suitable conductive material. The conductive structures (first conductive structure 270, second conductive structure 275, and conductive structures 280, 285, 290, 295, and 297) may be formed by CVD, PVD, ALD, or other suitable processes.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
a substrate comprising a well region, a first conductivity type doped region in the well region, and a second conductivity type doped region in the well region, wherein the second conductivity type doped region surrounds the first conductivity type doped region and comprises a first portion and a second portion perpendicular to the first portion in a top view;
an anti-fuse disposed in an anti-fuse region of the first conductivity type doped region;
a first transistor and a second transistor disposed in the well region, wherein the anti-fuse is disposed between the first transistor and the second transistor, and the anti-fuse is electrically connected to the first transistor and the second transistor;
a contact structure disposed above the anti-fuse; and
a dielectric layer disposed between the contact structure and the anti-fuse region of the first conductivity type doped region.

2. The semiconductor structure of claim 1, wherein the second conductivity type doped region further comprises a third portion parallel to the first portion in the top view.

3. The semiconductor structure of claim 2, wherein the second conductivity type doped region further comprises a fourth portion perpendicular to the third portion in the top view.

4. The semiconductor structure of claim 3, wherein the first portion, the second portion, the third portion, and the fourth portion of the second conductivity type doped region form a ring profile in the top view.

5. The semiconductor structure of claim 1, wherein a lengthwise direction of the contact structure is perpendicular to that of the second portion of the second conductivity type doped region in the top view.

6. The semiconductor structure of claim 1, further comprising:
a first contact and a second contact disposed above the anti-fuse region, wherein the first contact and the second contact are disposed on opposite sides of the contact structure.

7. The semiconductor structure of claim 1, further comprising:
a third contact disposed above a source/drain region of the first transistor; and
a fourth contact disposed above a source/drain region of the second transistor.

8. The semiconductor structure of claim 1, further comprising:
- a first conductive structure disposed above the first transistor and the anti-fuse such that the anti-fuse is electrically connected to the first transistor; and
- a second conductive structure disposed above the second transistor and the anti-fuse such that the anti-fuse is electrically connected to the second transistor.

9. The semiconductor structure of claim 1, wherein the first transistor and the second transistor are connected in parallel and share a gate structure.

10. The semiconductor structure of claim 9, wherein a top surface of the contact structure is substantially coplanar with a top surface of the gate structure of the first transistor.

11. A semiconductor structure, comprising:
- a substrate comprising a well region, a first conductivity type doped region in the well region, and a second conductivity type doped region in the well region, wherein the second conductivity type doped region surrounds the first conductivity type doped region and comprises a first portion and a second portion perpendicular to the first portion in a top view;
- an isolation structure disposed in the substrate and configured to electrically insulate the first conductivity type doped region from the second conductivity type doped region;
- an anti-fuse disposed in an anti-fuse region of the first conductivity type doped region;
- a first transistor and a second transistor disposed in the well region, wherein the anti-fuse is disposed between the first transistor and the second transistor, and the anti-fuse is electrically connected to the first transistor and the second transistor; and
- a contact structure disposed above the anti-fuse.

12. The semiconductor structure of claim 11, wherein the first transistor and the second transistor are connected in parallel and share a first gate structure.

13. The semiconductor structure of claim 12, further comprising:
- a third transistor and a fourth transistor, wherein the second transistor is closer to the third transistor than the first transistor, and the third transistor and the fourth transistor are connected in parallel and share a second gate structure.

14. The semiconductor structure of claim 13, wherein a minimum distance between the first gate structure and the second gate structure is in a range of about 40 nanometers to about 200 nanometers.

15. The semiconductor structure of claim 13, further comprising:
- a conductive structure disposed above the second transistor and the third transistor such that the second transistor is electrically connected to the third transistor.

16. The semiconductor structure of claim 11, wherein the well region has a conductivity type the same as that of the second conductivity type doped region and different from that of the first conductivity type doped region.

17. The semiconductor structure of claim 11, wherein the first portion of the second conductivity type doped region has a strip profile in the top view.

18. The semiconductor structure of claim 11, wherein the second portion of the second conductivity type doped region has a shape substantially the same as that of the first portion of the second conductivity type doped region in the top view.

19. The semiconductor structure of claim 11, wherein the second conductivity type doped region further comprises:
- a third portion parallel to the first portion in the top view; and
- a fourth portion perpendicular to the third portion in the top view.

20. The semiconductor structure of claim 19, wherein the first portion, the second portion, the third portion, and the fourth portion of the second conductivity type doped region form a ring profile in the top view.

* * * * *